(12) United States Patent
Gottwald et al.

(10) Patent No.: US 10,964,635 B2
(45) Date of Patent: Mar. 30, 2021

(54) POWER ELECTRONIC METAL-CERAMIC MODULE AND PRINTED CIRCUIT BOARD MODULE WITH INTEGRATED POWER ELECTRONIC METAL-CERAMIC MODULE AND PROCESS FOR THEIR MAKING

(71) Applicant: Schweizer Electronic AG, Schramberg (DE)

(72) Inventors: Thomas Gottwald, Dunningen (DE); Christian Rössle, St. Georgen (DE)

(73) Assignee: Schweizer Electronic AG, Schramberg (DE)

( * ) Notice: Subject to any disclaimer, the term of this patent is extended or adjusted under 35 U.S.C. 154(b) by 0 days.

(21) Appl. No.: 16/415,480

(22) Filed: May 17, 2019

(65) Prior Publication Data

US 2019/0363043 A1    Nov. 28, 2019

(30) Foreign Application Priority Data

May 22, 2018   (DE) ..................... 10 2018 207 955.2

(51) Int. Cl.
  *H05K 1/18*    (2006.01)
  *H01L 23/498*   (2006.01)
  (Continued)

(52) U.S. Cl.
  CPC .... *H01L 23/49822* (2013.01); *H01L 21/4857* (2013.01); *H01L 21/56* (2013.01); *H01L 23/049* (2013.01); *H01L 23/13* (2013.01); *H01L 23/15* (2013.01); *H01L 23/49866* (2013.01); *H01L 24/32* (2013.01); *H01L 24/83* (2013.01); *H05K 1/185* (2013.01); *H01L 2224/29111* (2013.01); *H01L 2224/29139* (2013.01); *H01L 2224/29147* (2013.01); *H01L 2224/32225* (2013.01); *H01L 2224/8382* (2013.01); *H01L 2224/8384* (2013.01); *H01L 2224/83801* (2013.01)

(58) Field of Classification Search
  USPC .......................................................... 361/761
  See application file for complete search history.

(56) References Cited

U.S. PATENT DOCUMENTS

| | | | |
|---|---|---|---|
| 3,744,120 | A | 7/1973 | Burgess et al. |
| 3,766,634 | A | 10/1973 | Babcok et al. |

(Continued)

FOREIGN PATENT DOCUMENTS

| | | |
|---|---|---|
| DE | 19740330 A1 | 3/1974 |
| DE | 3922485 C1 | 6/1990 |

(Continued)

OTHER PUBLICATIONS

German Search Report, German Patent Application No. 10 2018 207 955.2, dated Jan. 31, 2019.

*Primary Examiner* — Andargie M Aychillhum
(74) *Attorney, Agent, or Firm* — Shlesinger, Arkwright & Garvey LLP (57) ABSTRACT

A power-electronic metal-ceramic module (10) comprising a metal-ceramic substrate (12) made of a ceramic carrier (14) having a metal top and bottom ply (16, 18), which is joined on or in the metal top ply (16) and/or the metal bottom ply (18) with a metal layer (16, 18, 22, 23) forming a frame (24) for accommodating at least one electronic component (30) and at least one electronic component (30) accommodated in the frame (24).

9 Claims, 7 Drawing Sheets

(51) Int. Cl.
*H01L 21/48* (2006.01)
*H01L 23/00* (2006.01)
*H01L 21/56* (2006.01)
*H01L 23/15* (2006.01)
*H01L 23/13* (2006.01)
*H01L 23/049* (2006.01)

(56) References Cited

U.S. PATENT DOCUMENTS

| | | |
|---|---|---|
| 3,915,369 A | 10/1975 | Schmidt-Bruecken et al. |
| 5,699,027 A | 12/1997 | Tsuji et al. |
| 2005/0212387 A1 | 9/2005 | Sasagawa et al. |
| 2012/0107642 A1* | 5/2012 | Meyer ............... C04B 37/021 |
| | | 428/623 |
| 2013/0134300 A1* | 5/2013 | Kamamori ............ G01J 1/42 |
| | | 250/216 |
| 2018/0040562 A1 | 2/2018 | Loher et al. |
| 2018/0350780 A1 | 12/2018 | Fuergut et al. |

FOREIGN PATENT DOCUMENTS

| | | |
|---|---|---|
| DE | 102009041952 B4 | 7/2011 |
| EP | 0153618 A | 9/1985 |

* cited by examiner

POWER ELECTRONIC METAL-CERAMIC MODULE AND PRINTED CIRCUIT BOARD MODULE WITH INTEGRATED POWER ELECTRONIC METAL-CERAMIC MODULE AND PROCESS FOR THEIR MAKING

TECHNICAL AREA

The present invention relates to the field of power-electronic metal-ceramic substrates and in particular metal-ceramic substrates for electrical and electronic circuits or circuitry modules. The present invention furthermore relates to circuit board modules having integrated power-electronic metal-ceramic module.

DESCRIPTION OF THE PRIOR ART

Metal-ceramic substrates, in particular also those for electrical and electronic circuits or circuitry modules, i.e., in particular as circuit boards for such circuits or modules, are known in different embodiments from the prior art.

DE 10 2016 214 607 A1 discloses a power-electronic module made of a first layer composite having embedded semiconductor element and a second layer composite, which is joined together flatly with the first layer composite, is designed as a ceramic substrate, and is used for the heat dissipation of the first layer composite.

DE 10 2016 106 137 A1 discloses an electronics device housing, which comprises a ceramic DCB layer as a carrier for at least one semiconductor chip. The semiconductor chip comprises at least one contact pad having a contact element arranged thereon, and a dielectric layer is arranged on the semiconductor chip and the contact element, on which an encapsulation material is in turn applied.

Furthermore, the so-called "DCB method" (DCB: Direct Copper Bond) is known, which is used for bonding metal layers or plates (for example, copper plates or foils) to ceramic or ceramic layers. DCB methods for producing so-called DCB substrates are known, for example, from U.S. Pat. No. 3,744,120, DE 2 319 854 A1, DE 2 213 115 A, EP 0 153 618 A1, and DE 10 2010 049 499 A1.

ABSTRACT OF THE INVENTION

Proceeding therefrom, according to the invention a power-electronic metal-ceramic module having the features disclosed herein and a method having the features disclosed herein and also a method for producing a circuit board module having integrated power-electronic metal-ceramic module having the features disclosed herein and a circuit board module having integrated power-electronic metal-ceramic module having the features disclosed herein are proposed.

The basic concept of the invention is to provide a metal-ceramic module for embedding in a circuit board structure for forming a circuit board module for high-voltage applications, by a frame for accommodating at least one electronic component being formed in or on a metal ply of a metal-ceramic substrate, and the layer sequence thus formed being joined after the placement of at least one electronic component.

The term "frame" is to be understood in the context of the present invention as a recess formed to accommodate an electronic component in a metal layer (it is therefore a metal frame). The recess is adapted in its dimensions to the dimensions of the electronic component for the purpose of accommodation. Depending on the thickness of the metal layer, the recess can form a through frame (having opening extending through the metal layer) or a non-through frame (as a depression in the metal layer).

"Joining" (or "fusing") is, in the manufacturing technology according to DIN 8580, one (the fourth) of the six manufacturing main groups, using which two or more solid bodies having geometrically defined design are permanently connected (joined). In addition, so-called "shapeless material" is sometimes used in this case, the shape of which is not defined. The individual method groups are defined in greater detail in DIN 8593. The most important include in particular welding and also soldering and adhesive bonding. In the present case, in particular sintering, soldering, diffusion soldering, or the like come into consideration as possible joining processes.

A metal-ceramic substrate is understood in the present case as any type of ceramic carrier having metal top ply and metal bottom ply, in particular copper-laminated ceramic carriers, for example, DCB substrates (DCB: Direct Copper Bond). Such substrates are known to a person skilled in the art in the field of power electronics.

Electronic components to be placed on the metal-ceramic substrate can be, for example, power semiconductors, chips, bare die chips, transistors such as FETs, MOSFETs, IGBTs, etc., or the like.

A circuit board module is to be understood in principle in the context of the present invention as any type of circuit-board-like layer structure, which can be used either independently as a circuit board, as a module for circuitry, for example, on a cooling element, or as an intermediate product (semifinished product) provided for embedding in a larger circuit board.

The invention provides an economical method for producing a power-electronic metal-ceramic module, which may be laminated into a circuit board structure as an independent component easily and with little effort. It has proven to be advantageous according to the invention that drilling does not have to be performed through the ceramic body. In addition, a uniform pressure is exerted on the ceramic body during the lamination procedure by the metal frame enclosing the electronic component, so that the risk of damaging the ceramic carrier in the course of the lamination is reduced. Moreover, better heat spreading results from the presence of the metal frame.

The invention is particularly suitable for high-voltage applications and opens up good connection options of the ceramic body to a heat sink. Moreover, the invention enables a symmetrical layer structure, which is considered to be advantageous, to be achieved in a simple manner. One advantage is that the pocket holes for contacting the component can be attached to the same level and thus the difficulty of metallization of pocket holes of different depths can be avoided. A layer structure is provided by the invention which offers electrical insulation together with good heat conduction because of the use of a ceramic carrier between the electronic component and an opposing metal outer ply.

Further advantages and designs of the invention result from the description and the appended drawing.

It is self-evident that the above-mentioned features and the features to be explained hereafter are usable not only in the respective specified combination, but rather also in other combinations or alone, without leaving the scope of the present invention.

The invention is schematically illustrated in the drawing on the basis of exemplary embodiments and is described in detail hereafter with reference to the drawing.

DETAILED DESCRIPTION

Identical or similar elements in the figures are provided with identical reference signs.

The illustrations of FIGS. 1 to 7 show a possible sequence of the method according to the invention for producing a power-electronic metal-ceramic module 10. It is to be emphasized once again in this context that these are very schematic illustrations, which are not to scale, of the layer sequence, which are only to be used to clarify the method sequence according to the invention. In particular, the illustrations of the figures are not suitable for deriving size and/or thickness relationships of the individual layers, unless stated otherwise in the description.

Figure 1:
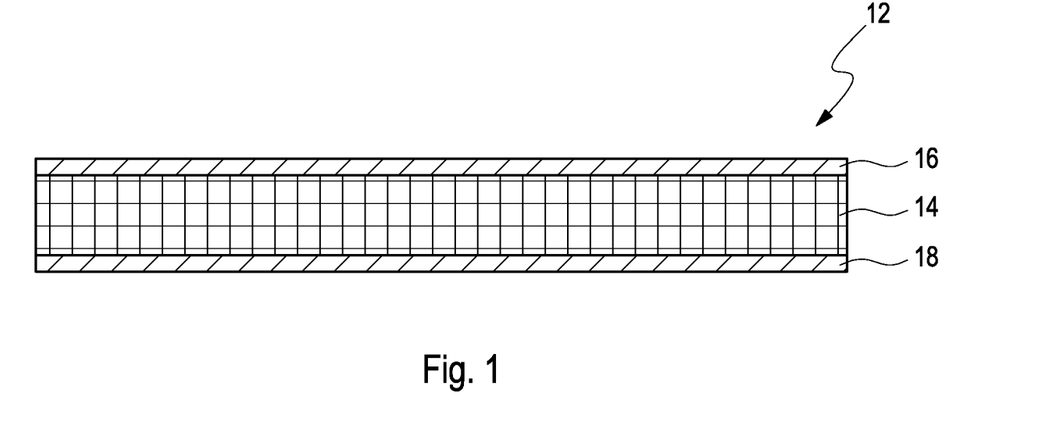
FIG. 1 shows a lateral schematic sectional illustration of a metal-ceramic substrate as a starting point of a metal-ceramic module of the invention.

FIG. 1 shows a lateral schematic sectional illustration of a metal-ceramic substrate 12, which comprises a ceramic carrier 14 having a metal top ply 16 and a metal bottom ply 18. The metal plies 16, 18 are, for example and in particular, copper plies. Such metal-ceramic substrates are available for example as so-called DCB substrates (DCB: Direct Copper Bond) (cf. above statements in the introduction to the description). For example, $Al_2O_3$, AlN (aluminum nitride), or other routine compounds for a person skilled in the art come into consideration as the ceramic material. Layer thicknesses of the ceramic typically run to approximately 100 to approximately 1000 μm, the thicknesses of the metal plies are also typically between approximately 100 and approximately 1000 μm.

In a next step, the metal top ply 16 and/or the metal bottom ply 18 can be structured in a manner known per se to form conductor tracks and/or conductor structures (for example, by etching or other processes routine to a person skilled in the art). In the illustrated exemplary embodiment, only a part of the metal top ply 16 is structured for illustration. Forming and/or structuring the metal bottom ply 18 in the same manner as the metal top ply 16 may be useful, as also shown for illustration in FIGS. 2 to 7. Possibly occurring tensions between the layers and on the ceramic layer are thus minimized and a creepage distance between the potentials is maximized.

Figure 2:
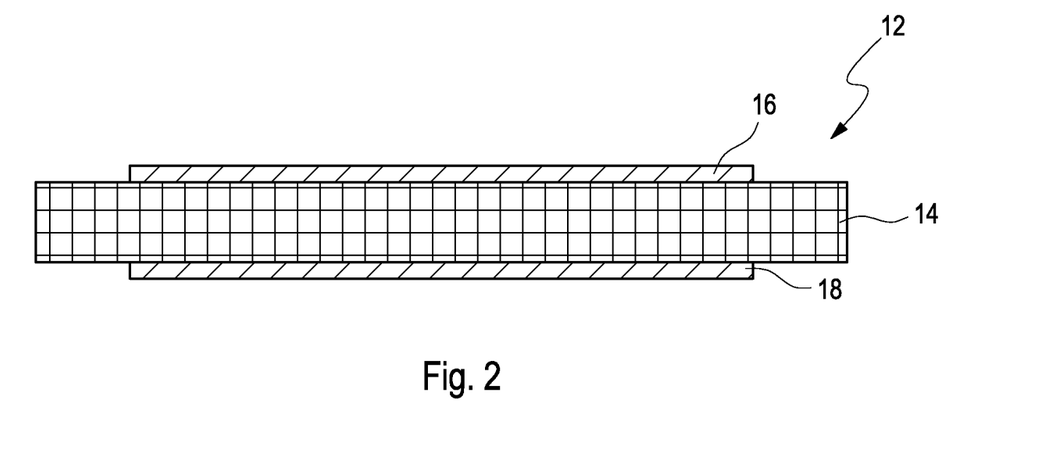
FIG. 2 shows the metal-ceramic substrate of FIG. 1 after structuring of the metal top ply.
Figure 3:
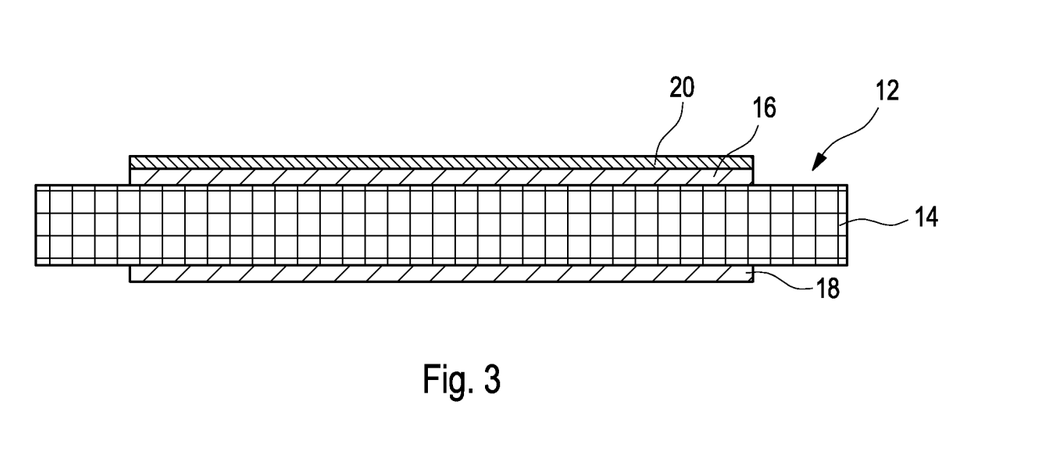
FIG. 3 shows the metal-ceramic substrate of FIG. 2 after application of packaging material to the structured metal top ply.

FIG. 3 shows the layer sequence of FIG. 2 after application of a layer 20 made of packaging material to the metal top ply 16. For this purpose, this is a material which assists the subsequent joining process, which represents a "shapeless material" in the meaning of the above DIN definition. In the scope of the present invention, for example, sintering paste (Ag, CuSn), solder, diffusion solder, or the like suggests itself for such connecting materials. Alternatively to the application to the metal ply shown in the figure, the packaging material used could be applied to a rear side or bottom side of the electronic component to be placed and/or of the metal frame 22/24. If a symmetrical layer structure is desired, a corresponding packaging layer 21 could thus also be applied to the metal bottom ply 18 (cf. also FIG. 7).

Subsequently, a metal layer 22 (in particular a copper layer) is applied to the metal top ply 16 and possibly the packaging layer 20 (cf. FIG. 4). According to the invention, the metal layer/copper layer 22 is formed as a frame 24, which represents a recess for accommodating at least one electronic component 30. According to the invention, the frame 24 can have multiple such recesses for accommodating multiple electronic components; in principle, however, it is also conceivable that alternatively or additionally two or more electronic components can be inserted into a single recess of the frame 24. The recesses for forming the frame 24 are produced, for example, by stamping, etching, or another measure known to a person skilled in the art. Additionally or alternatively to the above-described packaging layer 20, adhesion promoters and other suitable packaging materials can be applied to all metal surfaces to be joined of the metal plies 16, 18, 22, 23 and/or of the electronic component 30.

Figure 4:
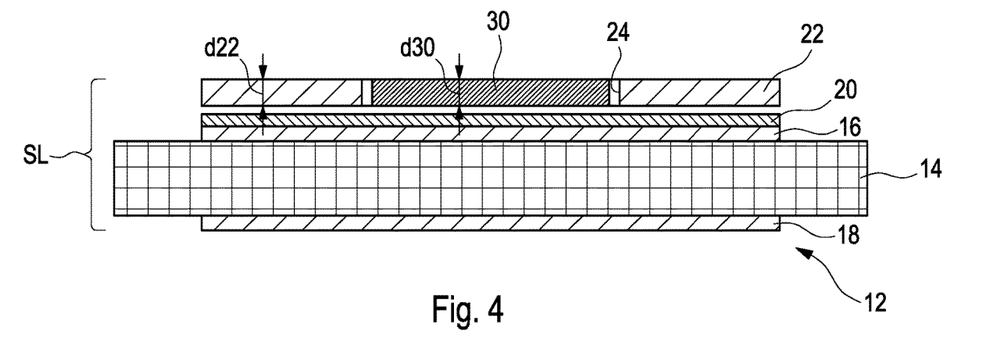
FIG. 4 shows the metal-ceramic substrate of FIG. 3 after application of a frame and an electronic component placed in the frame.

FIG. 4 shows an electronic component 30 already inserted into the frame 24 of the copper layer 22, such as a chip, transistor, or the like, the sequence of the placement is variable; the copper layer 22 can thus firstly be applied before the component 30 is placed in the recess, or frame 24 plus component 30 are applied in one work step. Of course, the variant of firstly applying the component 30 and subsequently the frame 24 is also conceivable.

Figure 5:
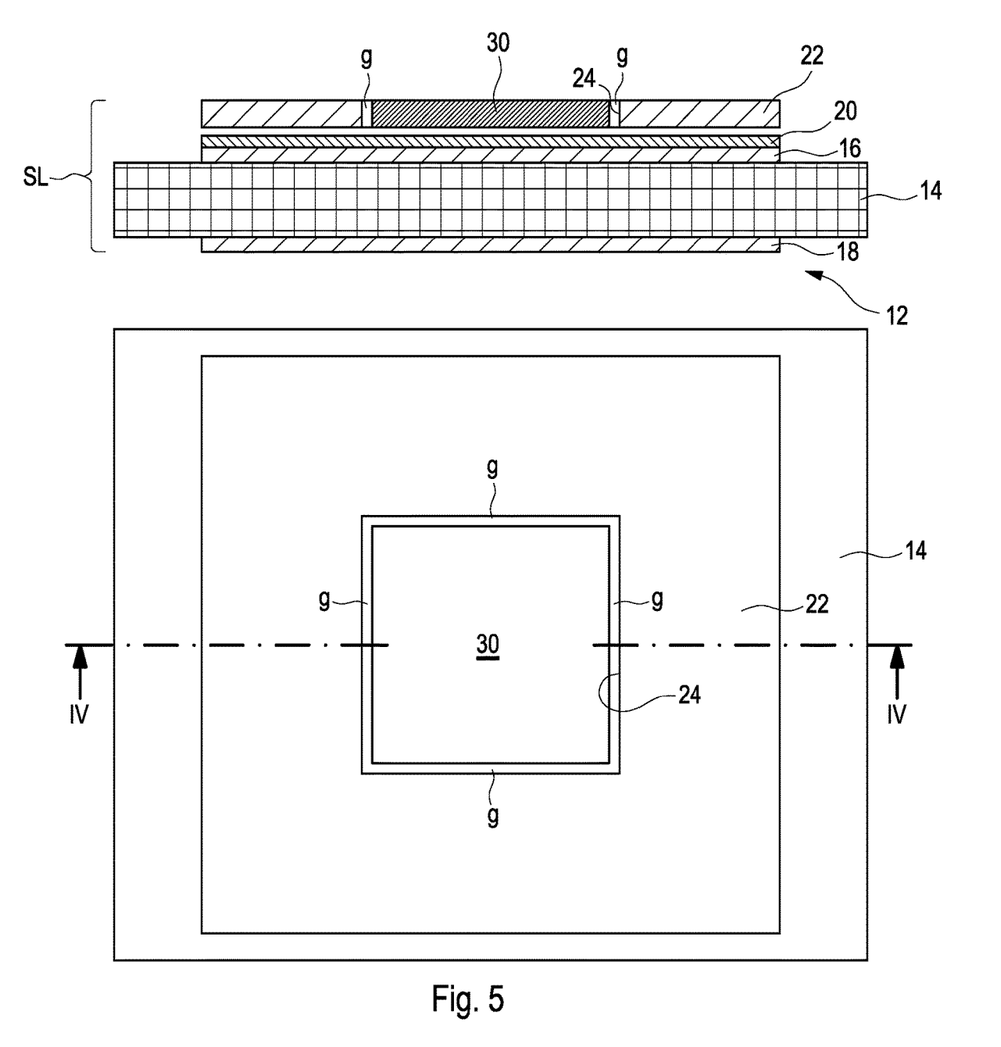
FIG. 5 additionally shows the layer sequence of FIG. 4 in a top view with indicated section line IV-IV.

FIG. 5 shows the layer sequence SL formed in FIG. 4 additionally having a (somewhat shrunken) top view of the copper frame 24 and the component 30 inserted therein. The section line IV-IV shown corresponds to the sectional view of FIG. 4.

On the one hand, it is apparent from the illustrations of FIGS. 4 and 5 that a thickness d22 of the copper layer 22 and thus also of the frame 24 corresponds to a thickness or height d30 of the component 30. On the other hand, the distances or gaps g between the component 30 and the surrounding frame 24 are recognizable. These distances g result from the fact that the internal dimensions of the frame recess are selected as somewhat larger than the external dimensions of the component to be placed.

The distance shown between the packaging layer 20 and the bottom side of the copper layer 22 and the electronic component 30 is merely to illustrate that a fixed connection is not yet provided here, but rather layer 22 and component 30 are merely put on. In reality, of course, no distance is present here.

Figure 6:
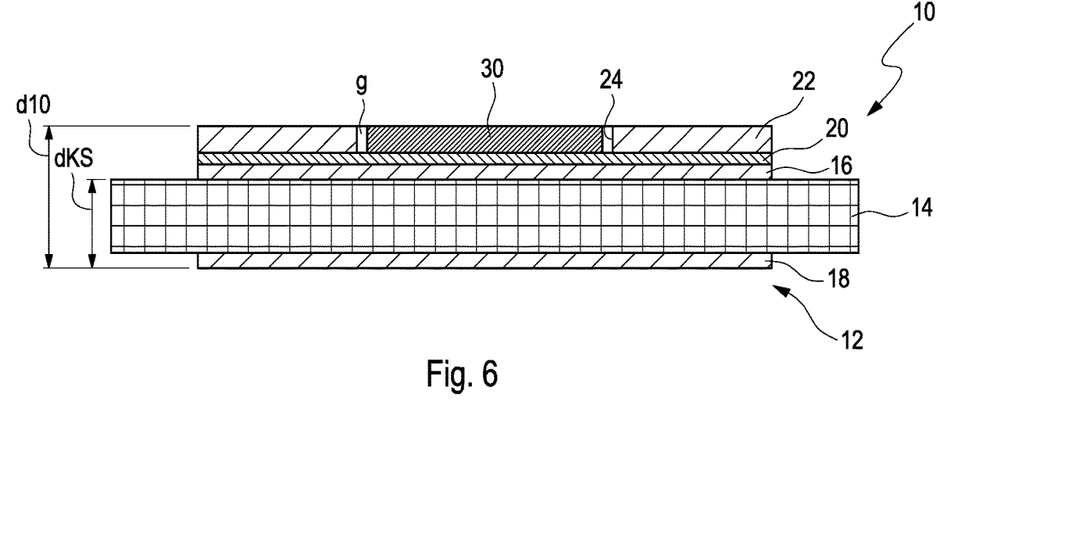
FIG. 6 shows the metal-ceramic module obtained by joining of the layer sequence of FIG. 4.

After the method step of joining, which then follows, of the layer sequence SL thus produced—as is apparent from FIG. 6—by definition a fixed and permanent bond is produced of the layer sequence SL placed, which forms a power-electronic metal-ceramic module 10 according to the invention. As already stated above, the joining takes place in a manner known per se to a person skilled in the art, for example, by means of sintering, soldering, diffusion soldering, or the like. As can be seen from the illustration of FIG. 6, the described gaps g between the electronic component 30 and the frame 24 enclosing it are still present—at least partially—even after completed joining.

Figure 7:
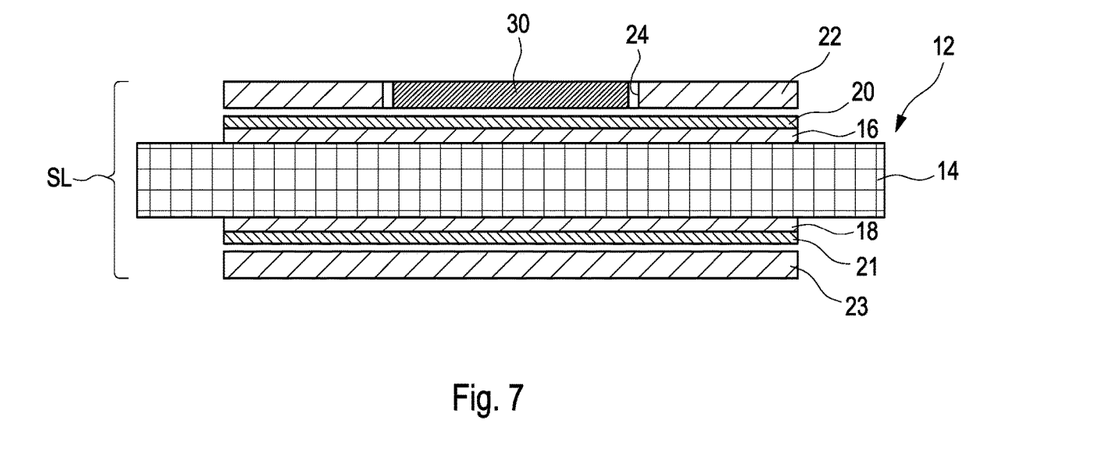
FIG. 7 shows an alternative design of the metal-ceramic module of FIG. 6 having a symmetrical layer structure (additional metal layer on the metal bottom ply).

FIG. 7 shows an alternative layer sequence SL before the step of joining, in which a packaging layer 21 is also applied to the metal bottom ply 18, onto which packaging layer a metal layer or preferably a copper layer 23 is in turn arranged, which is fixedly bonded to the metal bottom ply 18 in the subsequent step of joining. The copper layer 23 can optionally also be designed as a frame for accommodating an electronic component (not shown), so that a completely symmetrical layer sequence is achieved.

The power-electronic metal-ceramic module 10 produced according to the invention is distinguished by an additionally applied metal layer 22, 23, which forms a frame for accommodating at least one electronic component 30. The metal-ceramic module 10 thus produced represents an intermediate product or semifinished product, which is provided for embedding in a circuit board structure to form a circuit board module.

The production sequence of a circuit board module according to the invention is illustrated in FIGS. 8 to 12.

Figure 8:
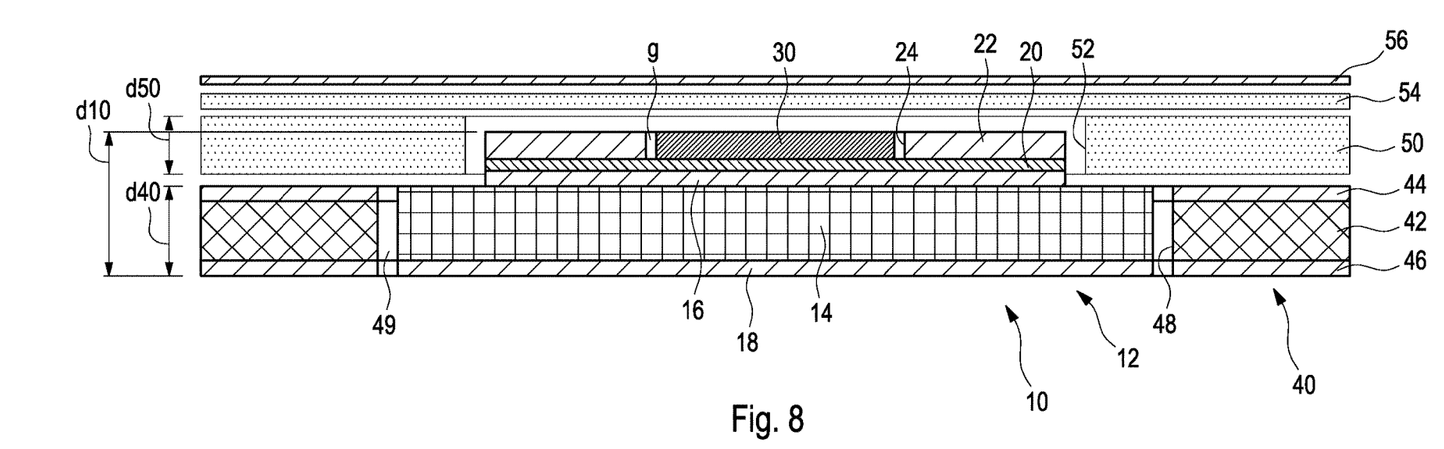
FIG. 8 shows a lateral schematic sectional illustration of a first step during the introduction of the metal-ceramic module of FIG. 6 into a circuit board base frame.

FIG. 8 shows how a metal-ceramic module 10 according to the invention (here: the metal-ceramic module of FIG. 6) is introduced as a semifinished product into a circuit board structure to form a circuit board module according to the invention.

Firstly, a circuit board base frame 40 made of a circuit board carrier material 42 (for example, made of FR4) is provided. The base frame 40 can be, as in the illustrated exemplary embodiment, for example, a metal-laminated and/or copper-laminated carrier material 42. The copper lamination consists of a top copper layer 44 and a bottom copper layer 46. The circuit board carrier material 42 has at least one through recess 48 for accommodating at least one metal-ceramic module. A metal-ceramic module 10 is inserted into the recess 48. The base frame (FR4 frame) 40 can be arranged for this purpose, for example, on a so-called press plate, preferably having an interposed film/separating film for protection from liquefied resin escaping during the following compression.

The circuit board base frame 40 has a thickness or height d40 which substantially corresponds to a thickness or height dKS of the ceramic substrate (possibly in consideration of a structuring of the metal top ply and/or metal bottom ply) (cf. FIG. 6).

Multiple insulation plies 50, 54, for example, prepreg plies, are applied to the circuit board base frame 40 and the metal-ceramic module 10. A first insulation or prepreg ply 50 is used for height equalization of the base frame 40 with the overall taller metal-ceramic module 10 and has for this purpose a cutout 52, so that the first prepreg ply 50 can be placed around the structure of the copper frame 22 and the component 30 accommodated therein. A height equalization is thus achieved; however, the thickness of the insulation ply is regularly selected as somewhat thicker in consideration of the subsequent lamination process, so that the thickness d40 of the base frame 40 and a thickness d50 of the first prepreg ply 50 somewhat exceed the total height d10 of the metal-ceramic module 10 (d40+d50≥d10).

A further continuous second prepreg ply 54 followed by a copper film 56 is applied to the substantially level surface thus resulting. In principle, in addition to the known and proven prepreg plies, other insulation plies with or without glass fibre fabric are also suitable for this process. For example, presently dried resin plies on foil are available, which also have prepreg properties, in particular liquefying and subsequently curing upon pressure and heating.

Subsequently, the layer structure thus obtained is compressed and/or laminated in a manner known per se to a person skilled in the art, whereby the resin of the prepreg plies 50, 54 liquefies and penetrates into the gaps 49 between the metal-ceramic module 10 and the base frame 40 and also in particular into the gaps g between the component 30 and the copper frame 22 and a uniform base structure of a circuit board module 60 according to the invention having integrated/embedded power-electronic metal-ceramic modules is thus produced (cf. FIG. 9).

Figure 10:
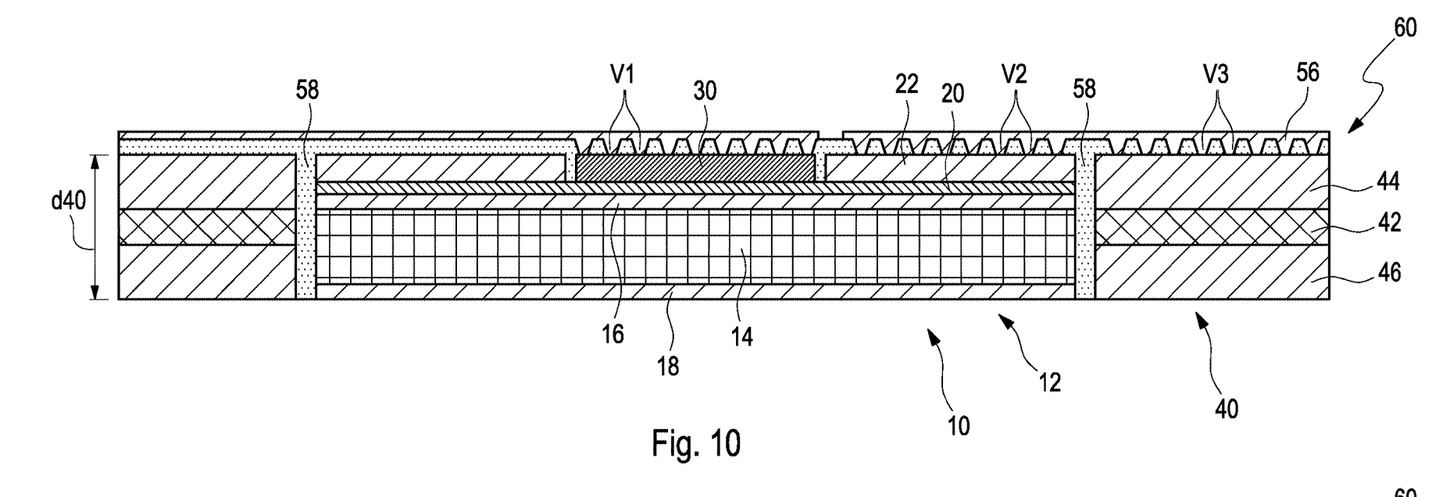
FIG. 10 shows the circuit board module of FIG. 9 having through contacts on the electronic component and internal copper layers.

After the compression/lamination and subsequent curing of the resin 58 liquefied during the lamination, through contacts V1, V2, V3 are produced from the top copper outer ply of the circuit board module 60, which is produced by the metal and/or copper film 56, in a manner known per se to a person skilled in the art, for example, by drilling (laser drilling) of pocket holes, to contact the electronic component 30 and internal copper layers 22, 44 of the embedded metal-ceramic module 10 and/or the circuit board base frame 40 (cf. FIG. 10).

Figure 9:
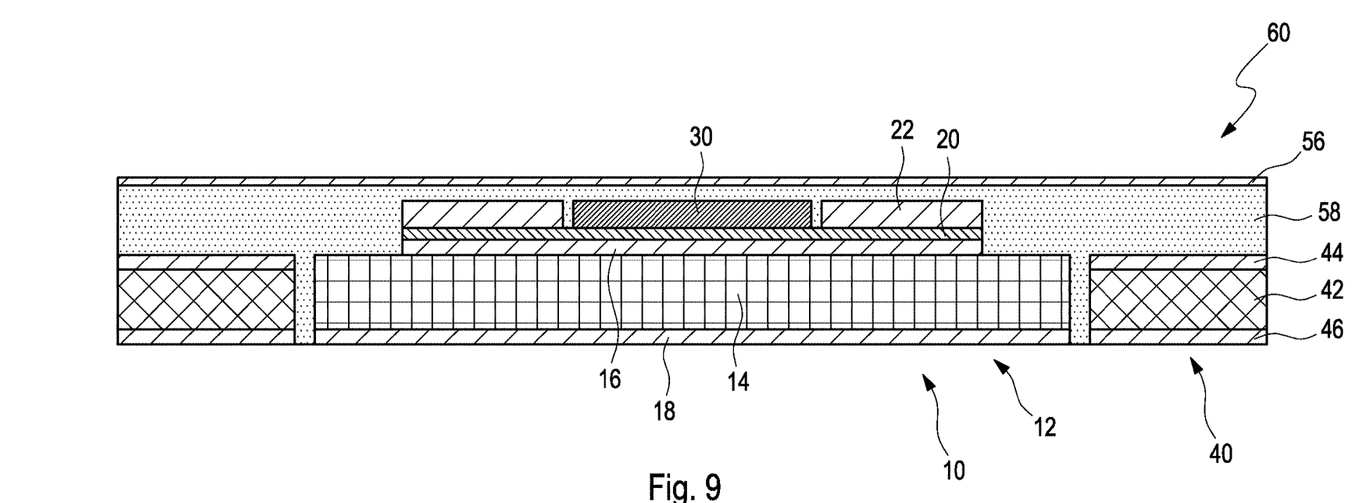
FIG. 9 shows a circuit board module obtained by compression of the layer sequence of FIG. 8 with prepreg layers and a copper foil.

It is to be noted in this context that FIG. 10 shows an alternative design in relation to the circuit board module 60 of FIG. 9, in which the circuit board base frame 40 has a significantly greater thickness d40 (which results from significantly thicker copper layers 44, 46 on the carrier material 42), which substantially corresponds to the total height d10 of the embedded metal-ceramic module 10. In such a constellation, the above-described first cutout prepreg ply 50 for height equalization can be omitted. Only one or also multiple continuous prepreg plies 54 are then to be applied, the thickness and resin content of which are dimensioned so that sufficient resin is available to fill up all gaps and cavities during the lamination.

In the two variants illustrated in FIGS. 9 and 10 of a circuit board module 60 according to the invention, the metal bottom ply 18 of the embedded metal-ceramic module 10 forms a bottom metal outer ply, so that the option exists here of a direct connection to a heat sink. It is self-evidently routine to a person skilled in the art that before such a connection, the bottom side of the circuit board module is to be cleaned of resin which possibly escaped during the lamination process.

Figure 11:
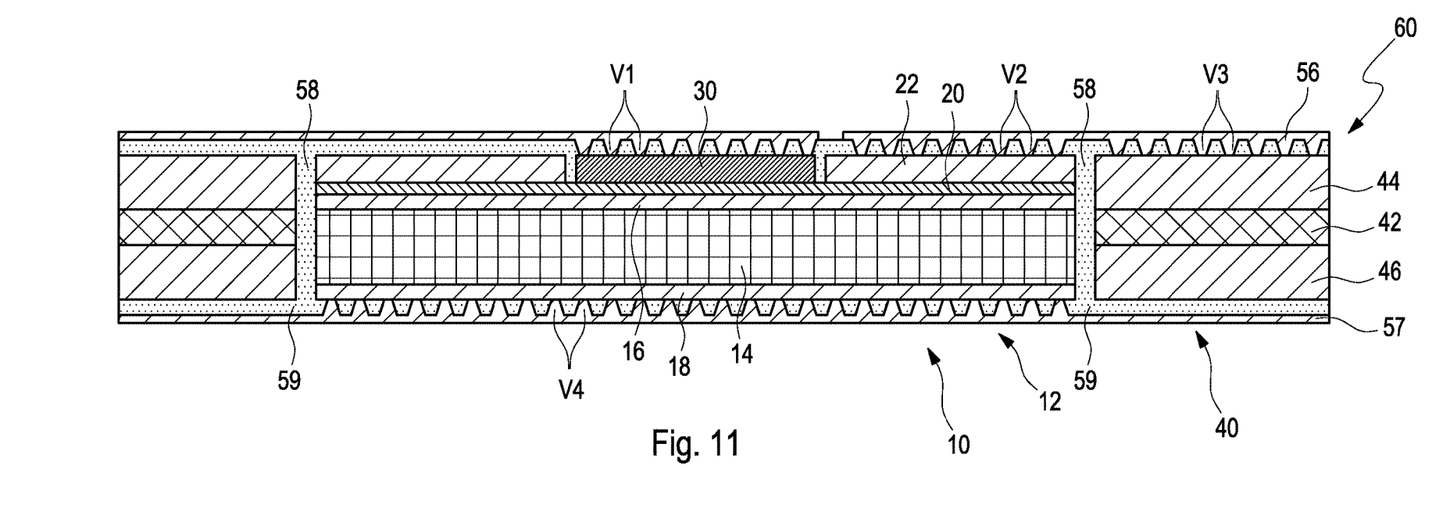
FIG. 11 shows a variant of the circuit board module according to the invention having symmetrical lamination of the metal-ceramic module.

FIG. 11 shows a further variant of a circuit board module 60 according to the invention, which has a symmetrical layer structure, in which a further insulation or prepreg ply 59 and also a metal foil/copper foil 57 for forming a bottom metal outer ply were introduced below the circuit board base frame 40. The metal-ceramic module is thus completely incorporated and/or embedded into the circuit board structure having resin layers 58, 59 located below and above it. Accordingly, similarly to the exemplary embodiment of FIG. 10, through contacts V4 are also formed from the bottom metal outer ply 57 for contacting the metal inner ply 18. The metal plies 44 and 46 can be used for low-induction current conduction in this structure. The thickness of the bottom insulation ply 59 is to be selected in this case so that the insulation requirements in relation to the heat sink are fulfilled, which would then be attached to the (bottom) metal outer ply 57.

Figure 12:
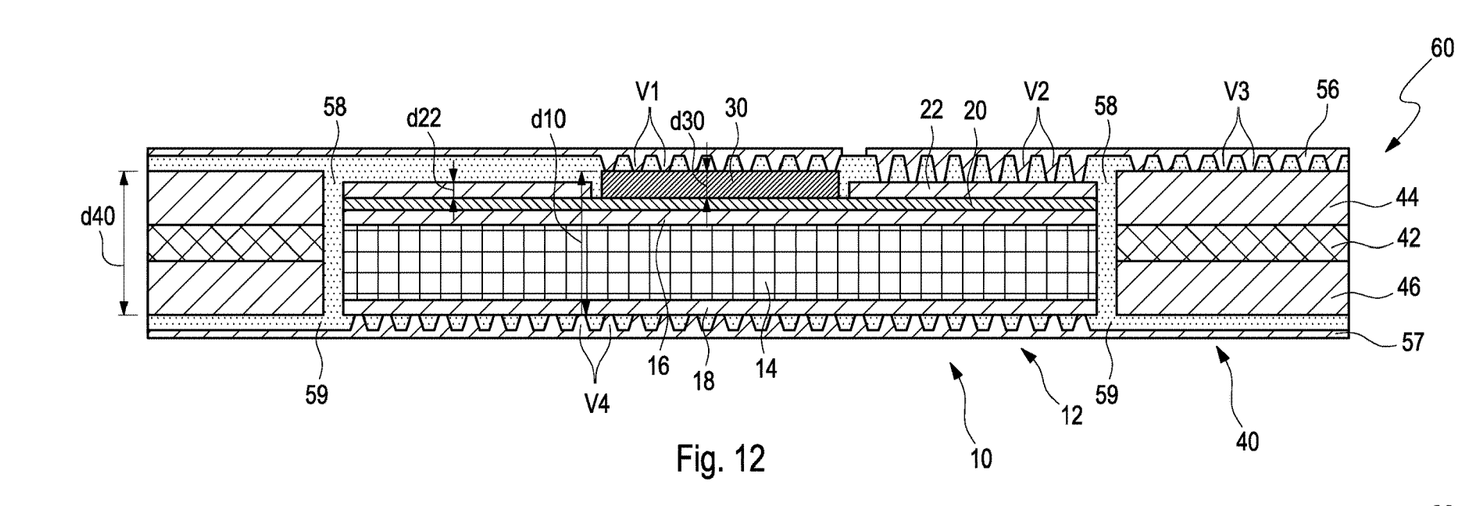
FIG. 12 shows a further variant of a circuit board module according to the invention with symmetrical lamination, but with electronic component protruding above the surrounding metal frame.

FIG. 12 shows a further variant of a circuit board module 60 according to the invention, which also has the symmetrical layer structure described in conjunction with FIG. 11 and corresponding bottom through contacts V4. In contrast to the above-described exemplary embodiments, in the variant of FIG. 12, the copper layer 22 forming the frame 24 for accommodating the electronic component 30 is formed having a lesser thickness d22 (i.e., d22<d30). The inserted electronic component 30 thus projects, as it were, beyond its surrounding frame 24. This has the result that the corresponding through contacts V2 for contacting the copper inner ply 22 have to be formed deeper, as can be seen from the illustration of FIG. 12. Such a design having a lesser frame thickness can be selected, for example, in the case of a higher insulation requirement for the top outer ply. The insulation layers are relatively thin (cf. the illustrations of FIGS. 10 and 11), so that in the case of a desired use of a circuit-board module according to the invention in a high-voltage application (approximately 5 kV to 10 kV or more), the thinner one can optionally be selected as shown to enhance the insulation layer, to reduce or preclude the risk of a high-voltage breakthrough. These considerations can possibly also be transferred to the design of the base frame 40, if its metal plies 44, 46 are to conduct a high voltage (i.e., a reduction of d40).

The contacts by means of the through contacts or vias V1 to V4 shown in FIGS. 10 to 12 are solely by way of example and can be designed by a person skilled in the art depending on the specific requirement profile or circuit board design according to the wishes/discretion of said person skilled in the art. Thus, for example, contacts downwards beyond the copper frame (not shown) can also be produced and/or a connection of the copper inner ply 44 to the top side of the component 30 can take place in the region of the circuit board base frame 40 located on the left in the illustrations of the figures. The illustrated connections could be, for example, source and drain connections if the electronic component 30 is a transistor (gate connection not shown).

Figure 13:
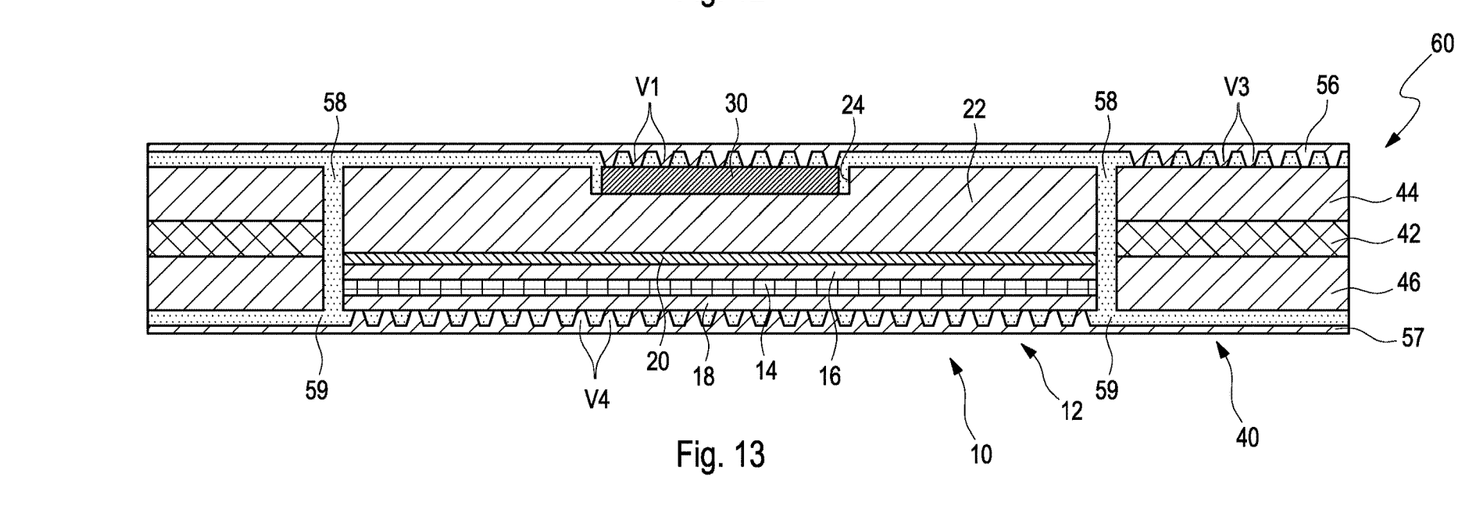
FIG. 13 shows a further variant of the circuit board module according to the invention having different dimensions of the ceramic carrier and the frame metal layer.

Finally, FIG. 13 shows for illustration a further variant of a circuit board module 60 according to the invention having an embedded power-electronic metal-ceramic module according to the invention, the ceramic carrier 14 of which has a lesser thickness in comparison to the above-described and illustrated variants, while the metal layer 22 forming the frame 24 is formed significantly thicker. In the variant of FIG. 13, the frame 24 for accommodating the electronic component 30 is not formed through, but rather only as a depression, the dimensions of which are adapted to the component dimensions.

The structure of a circuit board module 60 shown in FIG. 13 can be produced, for example, in a similar manner as the structure illustrated in FIG. 11. Alternatively, the metal ply 22 having the depression used as the frame 24 can be placed and joined beforehand with the electronic component 30, to then be applied as a prefinished unit having component (lead frame or lead frame package) onto a metal-ceramic substrate 12 (optionally having corresponding packaging layers as described above as intermediate layers) and joined therewith.

Figure 14:
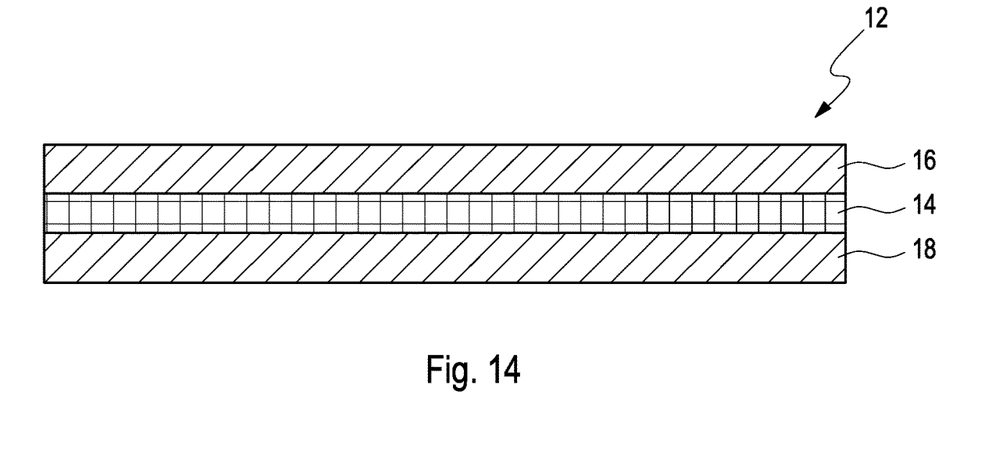
FIG. 14 shows a lateral schematic sectional illustration of a further metal-ceramic substrate as a starting point of an alternative of a metal-ceramic module of the invention.
Figure 15:
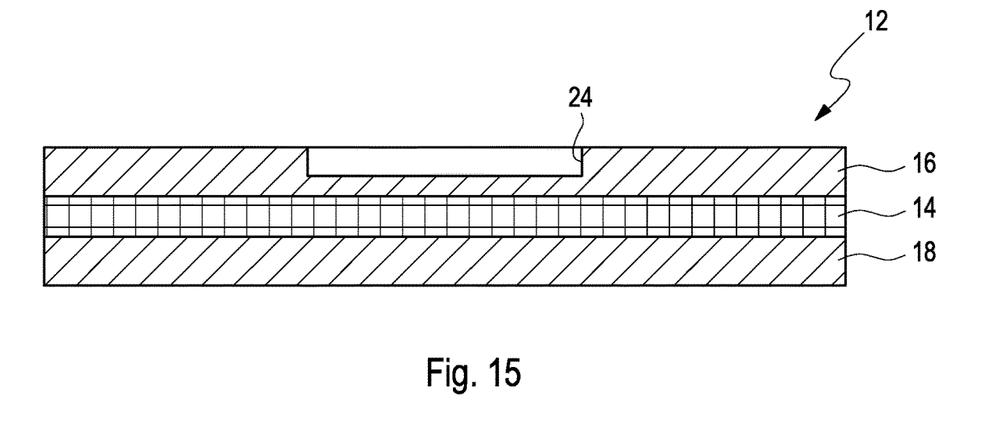
FIG. 15 shows the metal-ceramic substrate of FIG. 14 having an introduced depression as a frame for accommodating an electronic component.
Figure 16:
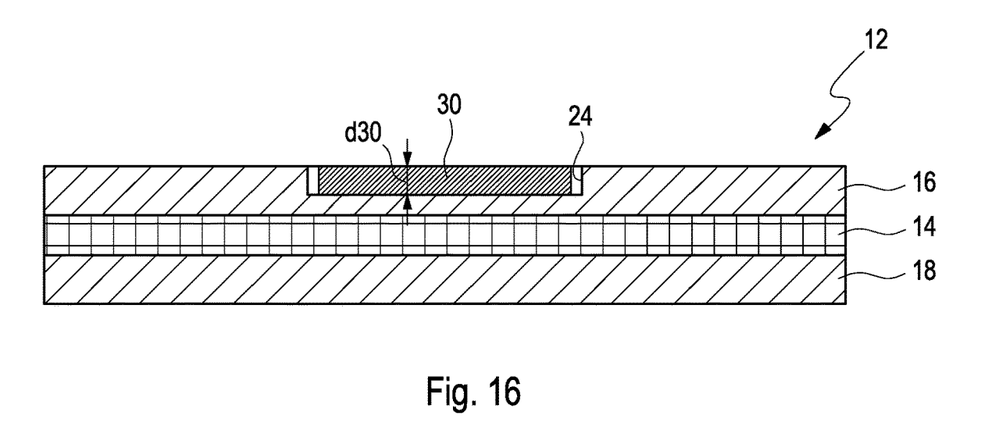
FIG. 16 shows the metal-ceramic substrate of FIG. 15 having inserted electronic component.

In FIGS. 14 to 16, the introduction of a frame 24 (in the form of a depression similarly as in the embodiment of FIG. 13) for accommodating an electronic component 30 in a metal top ply 16 of a metal-ceramic substrate (12) is shown as a further variant. For this purpose, a depression adapted to the dimensions of an electronic component 30 to be accommodated is produced in the metal top ply 16 by means of a suitable technology known per se to a person skilled in the art, for example, etching, milling, or the like (cf. FIGS. 14/15), which is used as a frame 24 for accommodating the electronic component 30 (FIG. 16).

It is readily apparent to a person skilled in the art that the constellations shown in FIGS. 9 to 13 can be combined as desired. Thus, for example, a symmetrical layer structure can also be implemented in the variant of FIG. 9 as in the variants of FIGS. 11 and 12, or the variant of FIG. 12 having lower frame 24 can be used in a layered structure as illustrated in FIG. 9 or 10.

The invention claimed is:

1. Method for producing a circuit board module with integrated power-electronic metal-ceramic module, comprising the following steps to form a first layer sequence:
   providing a circuit board base frame made of metal-laminated circuit board carrier material, the circuit board base frame including a first recess for accommodating a power-electronic metal-ceramic module;
   inserting the power-electronic metal-ceramic module into the first recess in the circuit board base frame, the power-electronic metal-ceramic module comprising a ceramic carrier having a metal top ply and a metal bottom ply and a frame including a second recess accommodating an electronic component, wherein the frame is formed in the metal top ply or the metal bottom ply, or wherein the frame is formed in a metal layer applied to the metal top ply or the metal bottom ply, respectively;
   applying insulation plies and at least one metal foil to form a top metal outer ply;
   compressing the first layer sequence in such a way that a liquefaction of the insulation plies occurs and liquid resin fills up gaps between the first recess and the power-electronic metal-ceramic module and gaps between the electronic component and the frame of the metal-ceramic module and subsequently curing the insulation plies; and
   producing through contacts and connecting the electronic component with the top metal outer ply.

2. Method according to claim 1, and further comprising selecting a thickness of the metal layer forming the frame to substantially correspond to a thickness of the electronic component or selecting a depth of the frame to substantially correspond to a thickness of the electronic component.

3. Method according to claim 1, wherein the power-electronic metal-ceramic module is made by the following steps to form a second layer sequence:
   providing the ceramic substrate having the metal top ply and the metal bottom ply;

forming the frame to accommodate the electronic component;

placing the electronic component in such a way that the electronic component is positioned in the frame, joining the second layer sequence.

4. Method according to claim 1, and further comprising selecting a thickness of the circuit board base frame to substantially correspond to a thickness of the metal-ceramic substrate.

5. Method according to claim 1, and further comprising selecting a thickness of a first insulation ply so that the thickness of the circuit board base frame is substantially equalized with a total height of the metal-ceramic module.

6. Method according to claim 1, and further comprising selecting a thickness of the circuit board base frame to substantially correspond to a thickness of the metal-ceramic module.

7. Circuit board module, comprising:
a circuit board base frame made of metal-laminated circuit board carrier material, the circuit board base frame including a first recess;
a power-electronic metal-ceramic module disposed in the first recess;
the power-electronic metal-ceramic module comprising a ceramic carrier having a metal top ply and a metal bottom ply, and a frame including a second recess accommodating an electronic component, wherein the frame is formed in the metal top ply or the metal bottom ply, or wherein the frame is formed in a metal layer applied to the metal top ply or the metal bottom ply, respectively;
insulation layers to embed the power-electronic metal-ceramic module in the first recess of the circuit board base frame;
a top metal outer ply; and
through contacts to connect the electronic component with top metal outer ply.

8. Circuit board module according to claim 7, wherein a thickness of the metal layer forming the frame substantially corresponds to a thickness of the electronic component or wherein a depth of the frame substantially corresponds to a thickness of the electronic component.

9. Circuit board module according to claim 7, wherein a thickness of the circuit board base frame substantially corresponds to a thickness of the metal-ceramic substrate, or wherein a thickness of the circuit board base frame substantially corresponds to a thickness of the metal-ceramic module.

* * * * *